(12) United States Patent
Zhang et al.

(10) Patent No.: US 11,589,471 B2
(45) Date of Patent: Feb. 21, 2023

(54) HINGE, HINGE ASSEMBLY AND FOLDABLE ELECTRONIC DEVICE

(71) Applicant: Beijing Xiaomi Mobile Software Co., Ltd., Beijing (CN)

(72) Inventors: Xuehu Zhang, Beijing (CN); Lianjia Zhao, Beijing (CN); Zhengquan Wang, Beijing (CN); Hongwei Jin, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 252 days.

(21) Appl. No.: 16/921,244

(22) Filed: Jul. 6, 2020

(65) Prior Publication Data

US 2021/0267077 A1 Aug. 26, 2021

(30) Foreign Application Priority Data

Feb. 20, 2020 (CN) .......................... 202010104844.6

(51) Int. Cl.
*H05K 5/02* (2006.01)
(52) U.S. Cl.
CPC ......... *H05K 5/0226* (2013.01); *H05K 5/0221* (2013.01)
(58) Field of Classification Search
CPC ..................................................... H05K 5/00
See application file for complete search history.

(56) References Cited

U.S. PATENT DOCUMENTS

| 10,036,188 | B1* | 7/2018 | Yao ......................... E05D 3/122 |
| 2014/0011548 | A1 | 1/2014 | Varela et al. |
| 2018/0335809 | A1 | 11/2018 | Wu et al. |

(Continued)

FOREIGN PATENT DOCUMENTS

| CN | 101124414 A | 2/2008 |
| CN | 202867539 U | 4/2013 |
| CN | 207018340 U | 2/2018 |

(Continued)

OTHER PUBLICATIONS

Supplementary European Search Report in European Application No. 20188525.8, dated Feb. 2, 2021.

(Continued)

*Primary Examiner* — Jerry Wu
(74) *Attorney, Agent, or Firm* — Finnegan, Henderson, Farabow, Garrett & Dunner, L.L.P.

(57) ABSTRACT

A hinge includes: a trajectory limiting mechanism, including a first slider and a second slider; a first hinge bracket, for cooperating with the first slider and the second slider, the first hinge bracket being configured to limit rotation trajectories of the first slider and the second slider; a synchronization mechanism, cooperating with the trajectory limiting mechanism, for driving the first slider and the second slider into rotation relative to the first hinge bracket in a preset direction respectively; and a locking mechanism, cooperating with the synchronization mechanism, the locking mechanism having a locked state in which the locking mechanism is configured to prevent movement of the synchronization mechanism to maintain a relative positional relationship between the first slider and the second slider.

19 Claims, 13 Drawing Sheets

(56) References Cited

U.S. PATENT DOCUMENTS

2020/0103935 A1    4/2020   Hsu

FOREIGN PATENT DOCUMENTS

| | | |
|---|---|---|
| CN | 108076171 A | 5/2018 |
| CN | 108919963 A | 11/2018 |
| CN | 109469680 A | 3/2019 |
| CN | 109654112 A | 4/2019 |
| CN | 209414383 U | 9/2019 |
| CN | 110332217 A | 10/2019 |
| CN | 110675746 A | 1/2020 |
| CN | 210007737 U | 1/2020 |
| EP | 3602530 A1 | 2/2020 |
| JP | S 622018 A | 1/1987 |
| JP | 2009293639 A | 12/2009 |
| JP | 2012129968 A | 7/2012 |
| KR | 100713480 B1 | 5/2007 |
| KR | 101856780 B1 | 5/2018 |
| KR | 101875855 B1 | 7/2018 |
| KR | 20190062107 A | 6/2019 |
| KR | 20190064552 A | 6/2019 |
| KR | 20190064939 A | 6/2019 |
| WO | WO 2010/125384 A1 | 11/2010 |
| WO | WO 2018/149238 A1 | 8/2018 |

OTHER PUBLICATIONS

Examination Report of Indian Application No. 202044032365, dated Nov. 15, 2021.

Grant of Patent of Korean Application No. 10-2020-0086632, dated Oct. 25, 2021.

Notice of Reasons for Refusal of Japanese Application No. 2020-120405, dated Dec. 16, 2021.

* cited by examiner

HINGE, HINGE ASSEMBLY AND FOLDABLE ELECTRONIC DEVICE

CROSS-REFERENCE TO RELATED APPLICATIONS

The present application is based upon and claims priority to Chinese Patent Application No. 202010104844.6, filed on Feb. 20, 2020, the entire contents of which are incorporated herein by reference.

TECHNICAL FIELD

The present disclosure relates to the technical field of terminals, and more particularly, to a hinge, a hinge assembly, and a foldable electronic device.

BACKGROUND

With the development of flexible organic light-emitting diode (OLED) display technology, as well as foldable electronic devices have the portability of ordinary electronic devices and provide great experience of large-screen display after unfolding, the foldable electronic devices have gradually become an important trend in the development of mobile terminals.

SUMMARY

According to a first aspect of an embodiment of the present disclosure, a hinge comprises: a trajectory limiting mechanism, comprising a first slider and a second slider; a first hinge bracket, cooperating with the first slider and the second slider, the first hinge bracket being configured to limit rotation trajectories of the first slider and the second slider; a synchronization mechanism, cooperating with the trajectory limiting mechanism, for driving each of the first slider and the second slider into rotation relative to the first hinge bracket around a preset direction; and a locking mechanism, cooperating with the synchronization mechanism, the locking mechanism having a locked state in which the locking mechanism is configured to prevent the movement of the synchronization mechanism to maintain a relative positional relationship between the first slider and the second slider.

According to a second aspect of an embodiment of the present disclosure, a hinge assembly for an electronic device comprises: at least one first hinge according to the first aspect; a first support steel sheet connected with the first slider; and a second support steel sheet, the second support steel sheet being connected with the second slider to change a relative positional relationship between the first support steel sheet and the second support steel sheet through a change in the relative positional relationship between the first slider and the second slider.

According to a third aspect of an embodiment of the present disclosure, a foldable electronic device comprises: the hinge assembly according to the second aspect; and a middle frame, the middle frame being connected with both the first support steel sheet and the second support steel sheet of the hinge assembly, to switch a state of the middle frame along with a positional change of the first support steel sheet and the second support steel sheet.

It is to be understood that both the foregoing general description and the following detailed description are exemplary and explanatory only and are not intended to limit the present disclosure.

BRIEF DESCRIPTION OF THE DRAWINGS

The accompanying drawings, which are incorporated in and constitute a part of this specification, illustrate embodiments of the present disclosure, and serve to explain the principles of the present disclosure together with the description.

DETAILED DESCRIPTION

Reference will now be made in detail to exemplary, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations of the present disclosure. Instead, they are merely examples of apparatuses and methods consistent with aspects related to the disclosure as recited in the appended claims.

Terms used in the present disclosure are for the purpose of describing exemplary embodiments only and are not intended to limit the present disclosure. For example, although the terms "first," "second," "third," etc. may be used to describe various information, the information should not be limited by these terms. These terms are only used to distinguish one category of information from another. For example, without departing from the scope of the present disclosure, first information may be termed as second information; and similarly, second information may also be termed as first information.

Figure 1:
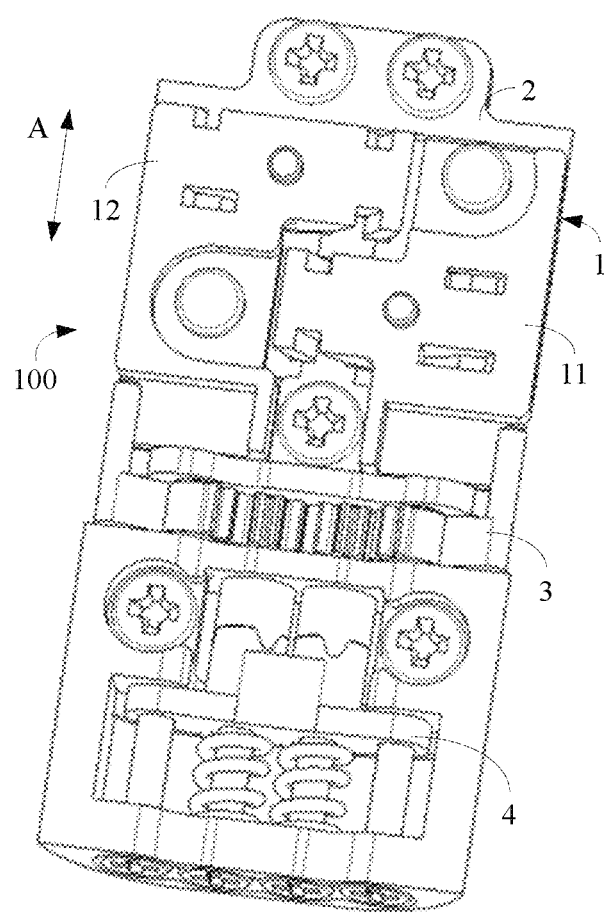
FIG. 1 is a schematic diagram illustrating a state of a hinge, according to an exemplary embodiment.
Figure 2:
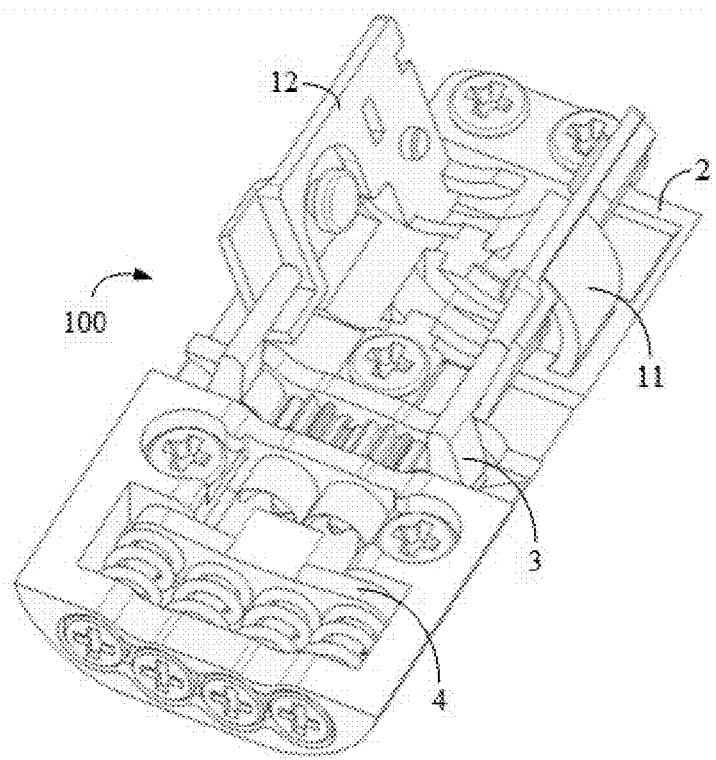
FIG. 2 is a schematic diagram of another state of the hinge, according to an exemplary embodiment.

FIG. 1 is a schematic diagram illustrating a state of a hinge 100 according to an exemplary embodiment. FIG. 2 is a schematic diagram illustrating another state of the hinge 100 according to an exemplary embodiment. As shown in FIG. 1 and FIG. 2, the hinge 100 may comprise a trajectory limiting mechanism 1, a first hinge bracket 2, a synchronization mechanism 3, and a locking mechanism 4. The trajectory limiting mechanism 1 may comprise a first slider 11 and a second slider 12. The first hinge bracket 2 cooperates with each of the first slider 11 and the second slider 12, to limit rotation trajectories of the first slider 11 and the second slider 12 by the first hinge bracket 2. For example, the first hinge bracket 2 may comprise an arc slot, each of the first slider 11 and the second slider 12 may comprise an arc portion that cooperates with the arc slot. The arc portion may slide along an inner surface of the arc slot, so that both of the first slider 11 and the second slider 12 may rotate around the preset direction indicated by arrow A, to switch the hinge 100 from the state shown in FIG. 1 to the state shown in FIG. 2.

The synchronization mechanism 3 may cooperate with the trajectory limiting mechanism 1, to drive each of the first slider 11 and the second slider 12 into rotation relative to the first hinge bracket 2 around a preset direction A. The synchronization mechanism 3 may also cooperate with the locking mechanism 4. The locking mechanism 4 may have a locked state. When the locking mechanism 4 is switched to the locked state, the locking mechanism 4 may be configured to prevent the movement of the synchronization mechanism 3. Thus, when the locking mechanism 4 is in the locked state, the synchronization mechanism 3 may not drive the first slider 11 and the second slider 12 to move, that is, when the locking mechanism 4 is in the locked state, the relative positional relationship between the first slider 11 and the second slider 12 is maintained unchanged, so that the hinge 100 may be maintained in the user's desired target state. For example, the hinge 100 may be maintained in the state shown in FIG. 1, or in the state shown in FIG. 2. The hinge 100 may also be maintained in other states, which is not limited in the present disclosure.

In the above embodiment, the rotation direction of the slider 11 and the slider 12 may be limited by the first hinge bracket 2 to avoid the slider 11 and the slider 12 from unnecessary movement strokes due to abnormal movement of the slider 2. Further, by means of the cooperation between the locking mechanism 4 and the synchronization mechanism 3, as well as the cooperation between the synchronization mechanism 3 and the trajectory limiting mechanism 1, the hinge 100 may be locked in the user's target state. For example, when the hinge 100 is applied to a foldable electronic device, the foldable electronic device may be maintained in an unfolded, flattened state or folded state by the locking mechanism 4, to improve user experience. Moreover, the trajectory limiting mechanism 1, the synchronization mechanism 3, and the locking mechanism 4 are disposed as a module in the same hinge 100, which is beneficial to reduce the number of components of the electronic device to which the hinge 100 is mounted, and beneficial to the control.

Figure 3:
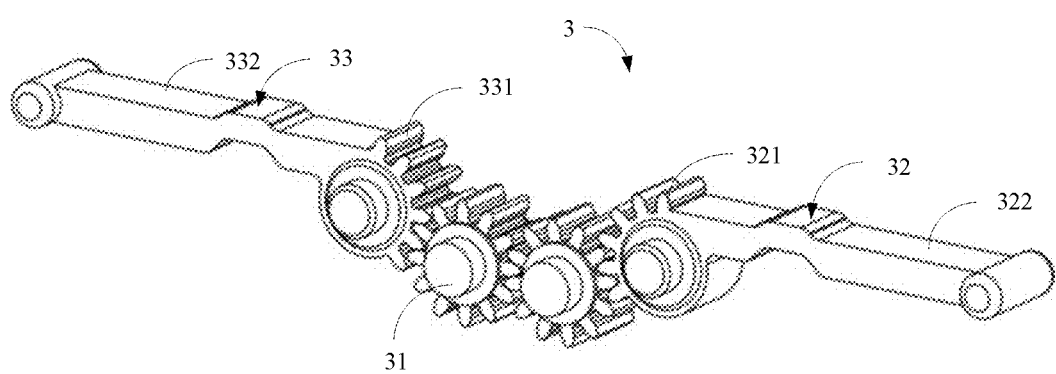
FIG. 3 is a schematic diagram illustrating a synchronization mechanism, according to an exemplary embodiment.

In an embodiment, as shown in FIG. 3, the synchronization mechanism 3 may comprise a cylindrical gear set 31, a first guide rod gear 32, and a second guide rod gear 33. The first guide rod gear 32 may comprise a gear end 321 and a guide rod end 322. Similarly, the second guide rod gear 33 may comprise a corresponding gear end 331 and a corresponding guide rod end 332. The gear end 321 of the first guide rod gear 32 is engaged with an end gear of the cylindrical gear set 31, and the gear end 331 of the second guide rod gear 331 is engaged with another end gear of the cylindrical gear set 31. The guide rod end 322 of the first guide rod gear 32 may extend to the first slider 11, and the guide rod end 332 of the second guide rod gear 33 may extend to the second slider 12, to drive each of the first slider 11 and the second slider 12 into rotation relative to the first hinge bracket 2, to achieve the state change of the hinge 100.

In this embodiment, an extension direction of the guide rod end 322 of the first guide rod gear 32 and an extension direction of the guide rod end 332 of the second guide rod gear 33 are parallel to each other, and are both perpendicular to a direction indicated by arrow A in FIG. 1 and perpendicular to a thickness direction B of the hinge 100. That is, the thickness direction B of the hinge 100, the extension direction of the guide rod end, and the direction indicated by arrow A are perpendicular to each other.

Figure 4:
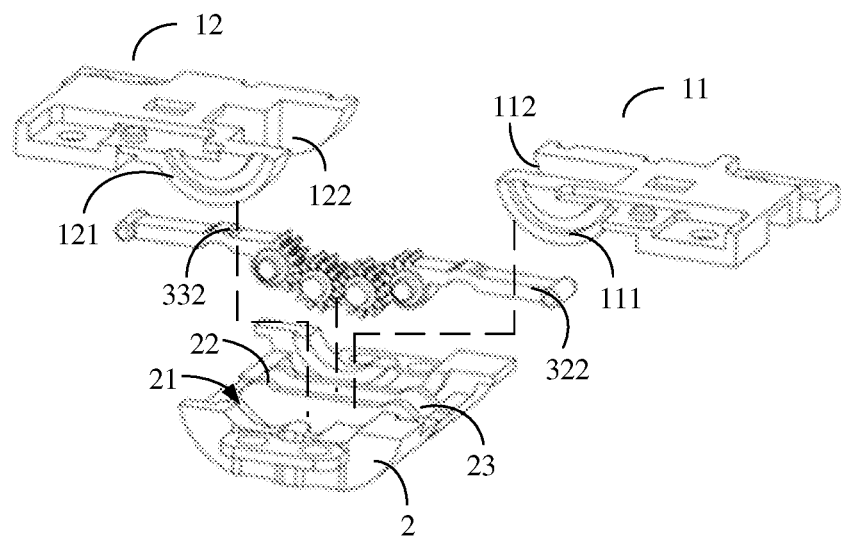
FIG. 4 is a schematic diagram illustrating cooperation between a synchronization mechanism and a trajectory limiting mechanism, according to an exemplary embodiment.

In this embodiment, the first slider 11 and the second slider 12 may be adaptively designed according to the extension direction of the guide rod end 322 of the first guide rod gear 32 and the extension direction of the guide rod end 332 of the second guide rod gear 33. For example, in order to achieve the rotation of the first slider 11 and the second slider 12 relative to the first hinge bracket 2, as shown in FIG. 4, the first hinge bracket 2 may comprise a first arc guiding portion 21, the first slider 11 may comprise a first arc portion 111, and the second slider 12 may comprise a second arc portion 121. Each of the first arc portion 111 and the second arc portion 121 cooperates with the first arc guiding portion 21. For example, outer peripheral surfaces of the first arc portion 111 and the second arc portion 121 are in contract with the arc surface of the first arc guiding portion 21 towards the first slider 11 and the second slider 12. As such, when the synchronization mechanism 3 rotates, the first arc portion 111 and the second arc portion 121 rotate under the limitation of the first arc guiding portion 21, to define movement trajectories for the first slider 11 and the second slider 12. In addition, a side corner radius of the hinge 100 formed after the folding is determined by the first arc guiding portion 21. Since the radian of the first arc guiding portion 21 is a fixed value, the side corner radius of the hinge 100 after the folding may be ensured to be unchanged, which is beneficial to reduce the damage to the screen of the foldable electronic device.

In this embodiment, in order to reduce the thickness of the hinge 100, as shown in FIG. 4, the first hinge bracket 2 may further comprise two upright blocks 22 each connected with the first arc guiding portion 21. Moreover, there is a certain separation distance provided between the two upright blocks 22, and the two upright blocks 22 may be located between two first arc portions 111 of the first slider 11 and two second arc portions 121 of the second slider 12, then the gear end 321 of the first guide rod gear 32, the gear end 331 of the second guide rod gear 33 as well as the cylindrical gear set 31 (shown in FIG. 5) are all disposed between the two upright blocks 22. The area of the bottom surface of the first arc guiding portion 21 which is located between the two upright blocks 22 may be adaptively designed according to the gear end 321 of the first guide rod gear 32, the gear end 331 of the second guide rod gear 33 as well as the cylindrical gear set 31, and the present disclosure is not limited thereto.

In this embodiment, there is an escape portion 23 defined by the two upright blocks 22 in the first arc guiding portion 21. In order to escape the escape portion 23, the first slider 11 may comprise a first recess portion 112 recessed in the extension direction of the guide rod end 322 of the first guide rod gear 32, and the second slider 12 may comprise a second recess portion 122 recessed in the extension direction of the guide rod end 332 of the second guide rod gear 33. The first recess portion 112 and the second recess portion 122 may both give way to the escape portion 23. Furthermore, in order to shorten the length of the first hinge bracket 2 in the extension direction of the guide rod end 322 of the first guide rod gear 32 and the extension direction of the guide rod end 332 of the second guide rod gear 33, a portion of the first slider 11 where the first arc portion 111 is provided may be located in the second recess portion 122. In other embodiments, a portion of the second slider 12 where the second arc portion 121 is provided may be located in the first recess portion 112, which is not limited in the present disclosure.

Figure 5:
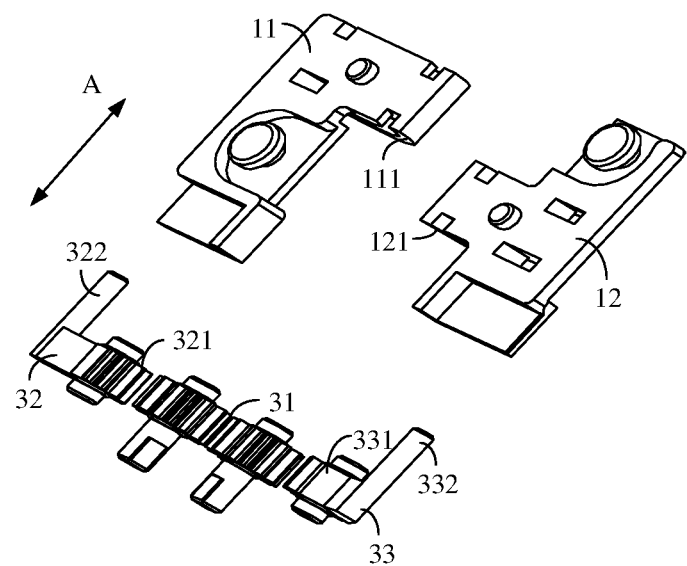
FIG. 5 is a schematic diagram illustrating cooperation between a synchronization mechanism and a trajectory limiting mechanism, according to an exemplary embodiment.
Figure 6:
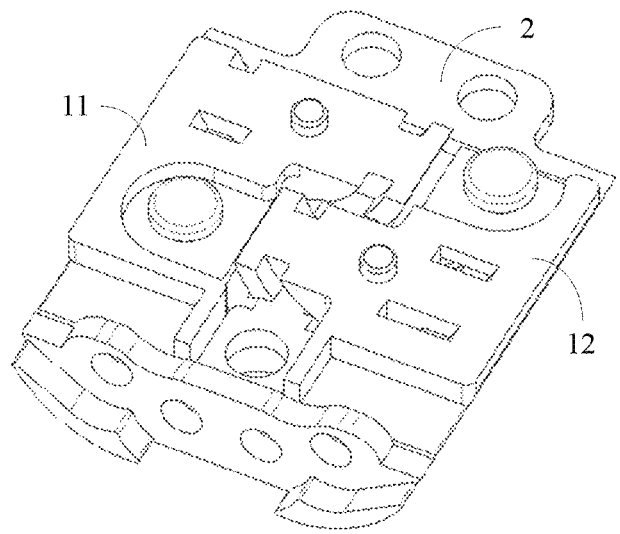
FIG. 6 is a schematic diagram illustrating a state of a trajectory limiting mechanism, according to an exemplary embodiment.
Figure 7:
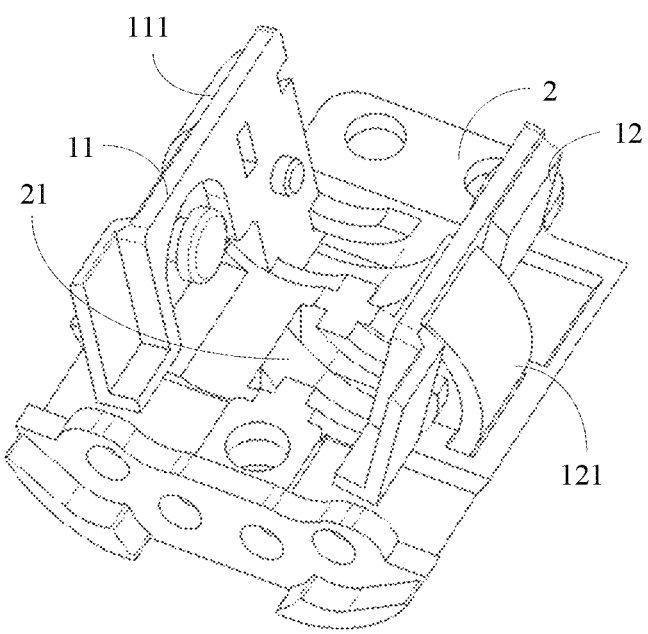
FIG. 7 is a schematic diagram of another state of the trajectory limiting mechanism in FIG. 6, according to an exemplary embodiment.
Figure 8:
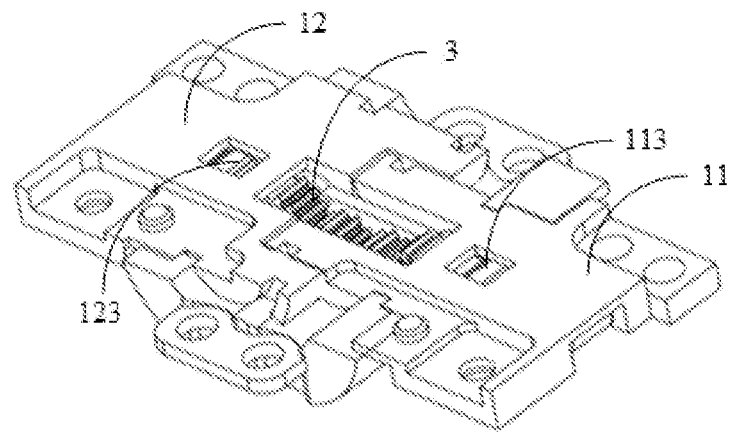
FIG. 8 is a schematic diagram illustrating cooperation between a synchronization mechanism and a trajectory limiting mechanism, according to an exemplary embodiment.
Figure 9:
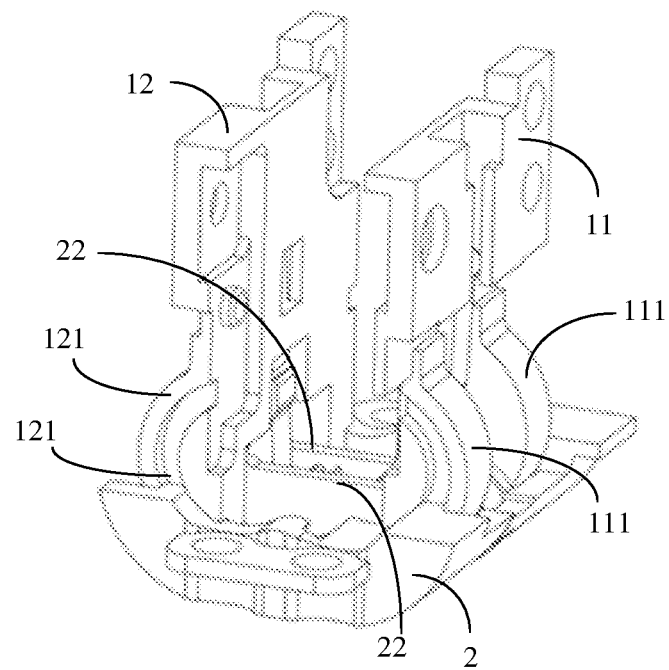
FIG. 9 is a schematic diagram of another state of the trajectory limiting mechanism in FIG. 8, according to an exemplary embodiment.
Figure 10:
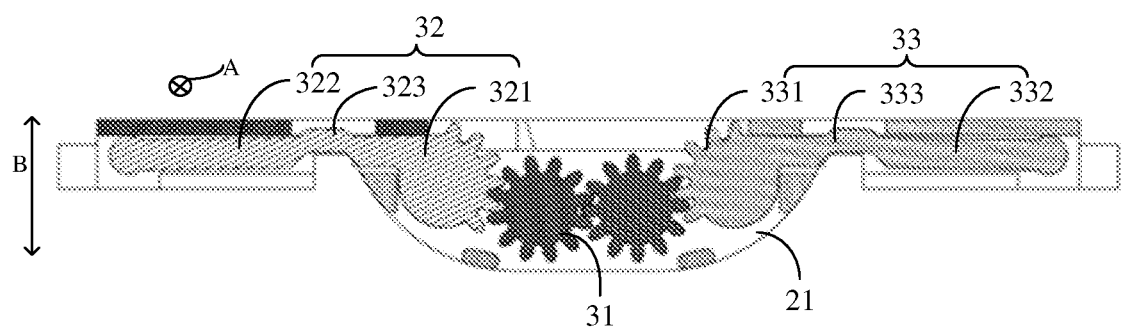
FIG. 10 is a schematic diagram illustrating cooperation between a synchronization mechanism and a trajectory limiting mechanism, according to an exemplary embodiment.
Figure 11:
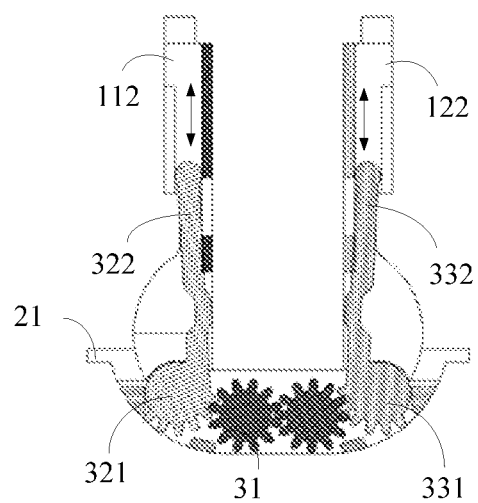
FIG. 11 is a schematic diagram of another state of the trajectory limiting mechanism in FIG. 10, according to an exemplary embodiment.

In another embodiment, as shown in FIG. 5-FIG. 7, the extension direction of the guide rod end 322 of the first guide rod gear 32 is the same as the extension direction of the guide rod end 332 of the second guide rod gear 33, and the extension direction of the guide rod end 322 of the first guide rod gear 32 and the extension direction of the guide rod end 332 of the second guide rod gear 33 are both parallel to the direction indicated by arrow A in FIG. 1. For example, as shown in FIG. 1 and FIG. 2, the trajectory limiting mechanism 1, the synchronization mechanism 3, and the locking mechanism 4 may be sequentially arranged in the direction of the rotation shafts of the first slider 11 and the second slider 12. As shown in FIG. 4, in order to allow the cooperation between the trajectory limiting mechanism 1 and the synchronization mechanism 3, the first hinge bracket 2 may comprise a first arc guiding portion 21, the first slider 11 may comprise a first arc portion 111, and the second slider 12 may comprise a second arc portion 121. Each of the first arc portion 111 and the second arc portion 121 cooperates with the first arc guiding portion 21. For example, outer peripheral surfaces of the first arc portion 111 and the second arc portion 121 are in contract with the arc surface of the first arc guiding portion 21 towards the first slider 11 and the second slider 12. As such, when the synchronization mechanism 3 rotates, the first arc portion 111 and the second arc portion 121 rotate under the limitation of the first arc guiding portion 21. For example, the relative positional relationship between the first slider 11 and the second slider 12 may be switched between the state shown in FIG. 6 and the state shown in FIG. 7. Furthermore, movement trajectories of the first slider 11 and the second slider 12 are ensured, and the side corner radius of the hinge 100 formed after the folding is determined by the first arc guiding portion 21. Since the radian of the first arc guiding portion 21 is a fixed value, the side corner radius of the hinge 100 after folding may be ensured to be unchanged, which is beneficial to reduce the damage to the screen of the foldable electronic device.

Moreover, the guide rod end 322 of the first guide rod gear 32 may be connected to one end of the first slider 11 adjacent to the synchronization mechanism 3, and the guide rod end 332 of the second guide rod gear 33 may be connected to one end of the second slider 12 adjacent to the synchronization mechanism 3. For example, a groove is formed on one end of the first slider 11 adjacent to the synchronization mechanism 3, and a groove is also formed on one end of the second slider 12 adjacent to the synchronization mechanism 3, to receive the guide rod end 322 of the first guide rod gear 32 and the guide rod end 332 of the second guide rod gear 33 respectively. The specific cooperation between the grooves and the guide rod end 322 of the first guide rod gear 32 and the guide rod end 332 of the second guide rod gear 33 is described in reference to the following embodiments.

In the above embodiments, the force applied by the guide rod end 322 of the first guide rod gear 32 and the guide rod end 332 of the second guide rod gear 33 can be transmitted to the first slider 11 and the second slider 12 through any one of the following ways.

In an embodiment, as shown in FIG. 8-FIG. 11, the first slider 11 may comprise a first hollow sliding slot 112, and the second slider 12 may comprise a second hollow sliding slot 122. The guide rod end 322 of the first guide rod gear 32 may extend into the first hollow sliding slot 112, and the guide rod end 332 of the second guide rod gear 33 may extend into the second hollow sliding slot 122, that is, the first slider 11 and the second slider 12 may be partially hollowed to obtain the corresponding hollow sliding slots. As such, when an external force acts on the hinge 100 and the force is further transmitted to the first slider 11, the gear end 321 may transmit the force to the cylindrical gear set 31 and further to the gear end 331 of the second guide rod gear 33 by the guide rod end 322 of the first guide rod gear 32 sliding in the first hollow sliding slot 112, so that the guide rod end 332 of the second guide rod gear 33 may be driven to slide in the second hollow sliding slot 122. Furthermore, due to the limitation of the first hollow sliding slot 112 and the second hollow sliding slot 122, the hinge 100 may be switched between the state shown in FIG. 8 and the state shown in FIG. 9, or may be switched between the state shown in FIG. 10 and the state shown in FIG. 11. That is, the angle of the first slider 11 relative to the first hinge bracket 2 and the angle of the second slider 12 relative to the first hinge bracket 2 at the same time may be substantially the same (i.e., the difference between the angle of the first slider 11 relative to the first hinge bracket 2 and the angle of the second slider 12 relative to the first hinge bracket 2 is small, and is within the allowable range), and thus the synchronous movement of the first slider 11 and the second slider 12 is substantially accomplished. The force acting on the first slider 11 is used only as an example for description. As for the case where the force is transmitted to the second slider 12, or the force is transmitted to the first slider 11 and the second slider 12, reference may be made to the above embodiment.

In this embodiment, as still shown in FIG. 8-FIG. 11, the first slider 11 may further comprise a first through portion 113, through which the first hollow sliding slot 112 may be opened into the outside. Similarly, the second slider 12 may further comprise a second through portion 123, through which the second hollow sliding slot 122 may be opened into the outside. The first guide rod gear 32 may further comprise a first protrusion 323, and the second guide rod gear 33 may further comprise a second protrusion 333. A portion of the first protrusion 323 protrudes into the first through portion 113, and a portion of the second protrusion 333 protrudes into the second through portion 123. As such, when the hinge 100 is fully unfolded, the first protrusion 323 may be limited by the first through portion 113, and the second protrusion 333 may be limited by the second through portion 123. When the hinge 100 is fully folded, the first protrusion 323 may be limited by the first through portion 113, and the second protrusion 333 may be limited by the second through portion 123, to avoid the hinge 100 from being excessively splayed or excessively folded.

It should be noted that, the hollow sliding slots hollowed in the first slider 11 and the second slider 12 which cooperate with the guide rod ends may be hollow sliding slots as described in the embodiment in FIG. 3 above, and may also be hollow sliding slots as described in the embodiment shown in FIG. 5, which is not limited in the present disclosure.

Figure 12:
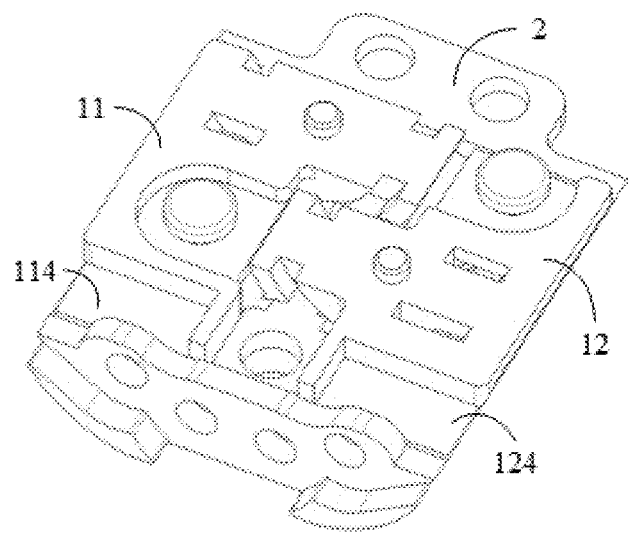
FIG. 12 is a schematic diagram illustrating another trajectory limiting mechanism, according to an exemplary embodiment.
Figure 13:
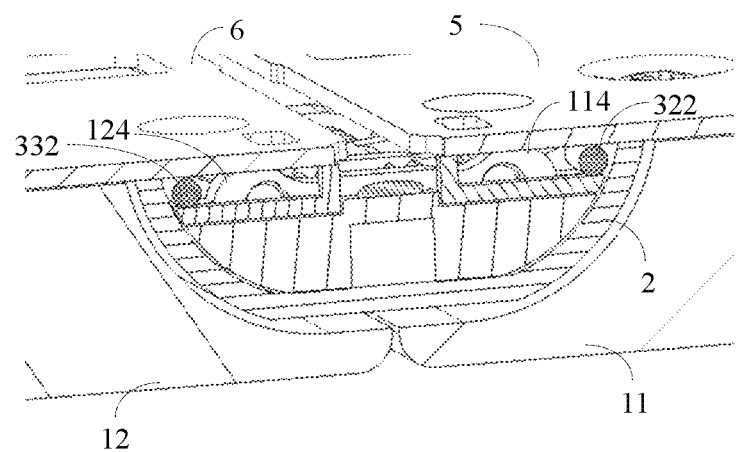
FIG. 13 is a schematic cross-sectional diagram illustrating a synchronization mechanism and a trajectory limiting mechanism, according to an exemplary embodiment.
Figure 14:
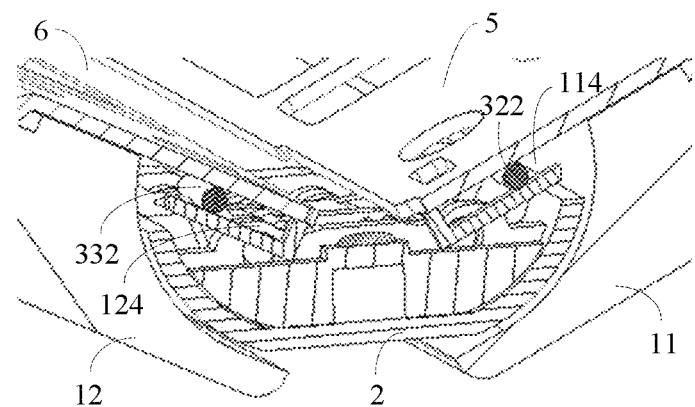
FIG. 14 is a schematic diagram of another state of the trajectory limiting mechanism in FIG. 13, according to an exemplary embodiment.

In another embodiment, as shown in FIG. 12-FIG. 14, the first slider 11 may comprise a first groove 114, and the second slider 12 may comprise a second groove 124. The hinge 100 may further comprise a first limiting plate 5 and a second limiting plate 6, the first limiting plate 5 may cover the first groove 114 to form a sliding slot that cooperates with the guide rod end 322 of the first guide rod gear 32, and the second limiting plate 6 may cover the second groove 124 to form a sliding slot that cooperates with the guide rod end 332 of the second guide rod gear 33. By the limitation of the first limiting plate 5 and the second limiting plate 6, the first slider 11 may be driven into rotation by the guide rod end 322 of the first guide rod gear 32, and the second slider 12 may be driven into rotation by the guide rod end 332 of the second guide rod gear 33. For example, the first slider 11 and the second slider 12 can both be switched between the state shown in FIG. 13 and the state shown in FIG. 14. As for the specific force transmission manner, reference may be made to the above embodiments, and is not described further.

It should be noted that, the implementation in which the grooves are formed on each of the first slider 11 and the second slider 12 and the movement is further transmitted by the limitation of the first limiting plate 5 and the second limiting plate 6, may be applied to the embodiment in FIG. 5, and may also be applied to the embodiment shown in FIG. 3, which is not limited in the present disclosure.

Figure 15:
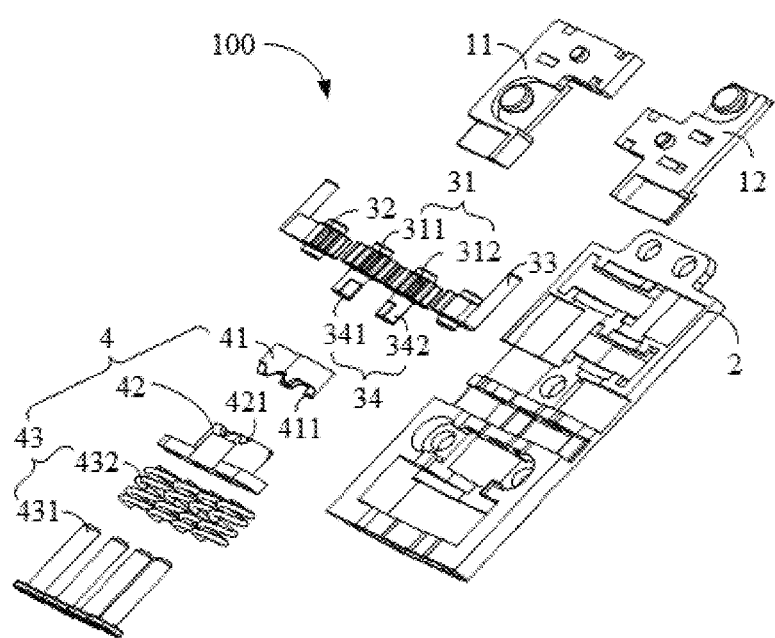
FIG. 15 is an exploded schematic diagram illustrating a hinge, according to an exemplary embodiment.

An exemplary structure of the locking mechanism 4 will be described below. As shown in FIG. 15, the synchronization mechanism 3 may comprise rotating shafts 34, each of which may correspond to a respective one of the gears of the cylindrical gear set 31. For example, as shown in FIG. 15, the synchronization mechanism 3 may comprise a first rotating shaft 341 and a second rotating shaft 342, and the cylindrical gear set 31 may comprise a first gear 311 and a second gear 312. The first gear 311 is connected to the first rotating shaft 341, and the second gear 312 is connected to the second rotating shaft 342, thus the first rotating shaft 341 and the second rotating shaft 342 may be driven into rotation by the first gear 311 and the second gear 312, respectively. The locking mechanism 4 may comprise a first transmission member 41 and a second transmission member 42, the first transmission member 41 may be connected with at least one of the rotating shafts 34 and rotate with the rotating shafts 34. When the rotating shafts 34 drive the first transmission member 41 to be switch to a preset cooperation state with the second transmission member 42, the locking mechanism 4 is switched to a locked state.

In an embodiment, the second transmission member 42 may comprise a snap. When the first transmission member 41 rotates until it is engaged into the snap, the locking mechanism 4 is switched to a locked state. In another embodiment, as still shown in FIG. 15, the first transmission member 41 may comprise a protruding portion 411, and the second transmission member 42 may comprise a recess portion 421. When the protruding portion 411 is engaged into the recess portion 421, the first transmission member 41 and the second transmission member 42 are switched to the preset cooperation state. The number of the protruding portions 411 and the recess portions 421 may be equal or not equal. In an embodiment, the number of the protruding portions 411 and the recess portions 421 is equal, and all the protruding portions 411 are engaged into the corresponding recess portions 421 at the same time, and the current state of the hinge 100 may be maintained at this time. In another embodiment, the number of the protruding portions 411 and the recess portions 421 may be not equal, for example, there may be one protruding portion 411 and a plurality of recess portions 421 distributed uniformly. When the protruding portion 411 is engaged into the different recess portions 421, the hinge 100 may be limited to be in different target states to improve the hand feeling of the folding of the foldable electronic device equipped with the hinge 100.

In an embodiment, the first transmission member 41 and the second transmission member 42 may both be made of rigid materials, and the locking mechanism 4 may further comprise a buffering member 43 which is in contract with the second transmission member 42, in order to ensure smooth rotation of the first transmission member 41. When the second transmission member 42 moves in the extension direction of the rotation shafts 34 under the action of the first transmission member 41, the buffering member 43 may be extended or compressed, to provide space for the protruding portions 411 and the recess portions 421 to cooperate with each other.

In an embodiment, the buffering member 43 may comprise a telescopic flexible member. For example, the telescopic flexible member may be made of plastically deformable materials such as foam, rubber, or silicone. In another embodiment, as shown in FIG. 15, the buffering member 43 may comprise a guide rod 431 and a compression spring 432. One end of the guide rod 431 is connected to the second transmission member 42, and the other end is connected to the first hinge bracket 2. The compression spring 432 is mounted around the guide rod 431, and is in contract with the second transmission member 42. When the first transmission member 41 rotates, the second transmission member 42 may move away from the synchronization mechanism 3, to compress the compression spring 432. Alternatively, when the first transmission member 41 rotates, the second transmission member 42 may move towards the synchronization mechanism 3, to compress the compression spring 432.

Figure 16:
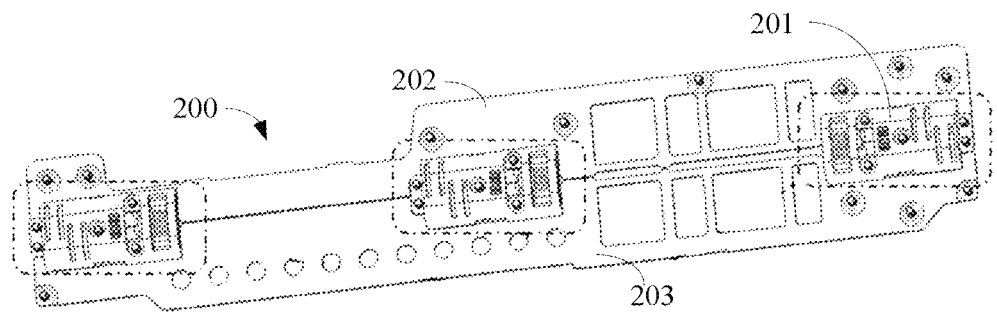
FIG. 16 is a schematic diagram illustrating a hinge assembly, according to an exemplary embodiment.

Based on the above embodiments, the present disclosure further provides a hinge assembly 200 as shown in FIG. 16, which may be applied in a foldable electronic device. The hinge assembly 200 may comprise at least one first hinge 201, a first support steel sheet 202, and a second support steel sheet 203. The first hinge 201 may be the hinge 100 described above. The first support steel sheet 202 may be connected with the first slider 11, and the second support steel sheet 203 may be connected with the second slider 12, to change a relative positional relationship between the first support steel sheet 202 and the second support steel sheet 203 through a change in the relative positional relationship between the first slider 11 and the second slider 12, so that the first support steel sheet 202 and the second support steel sheet 203 may be in a flat state or at a non-zero angle therebetween.

Figure 17:
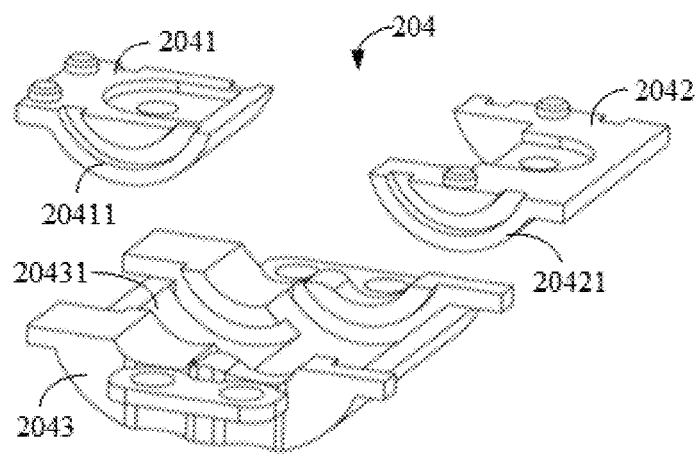
FIG. 17 is an exploded schematic diagram illustrating a second hinge, according to an exemplary embodiment.
Figure 18:
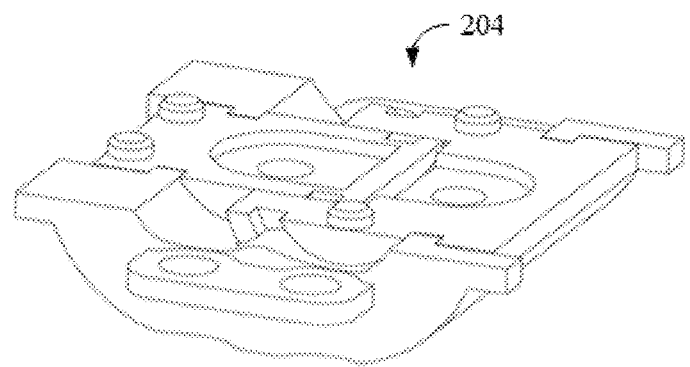
FIG. 18 is a schematic diagram illustrating a state of a second hinge, according to an exemplary embodiment.
Figure 19:
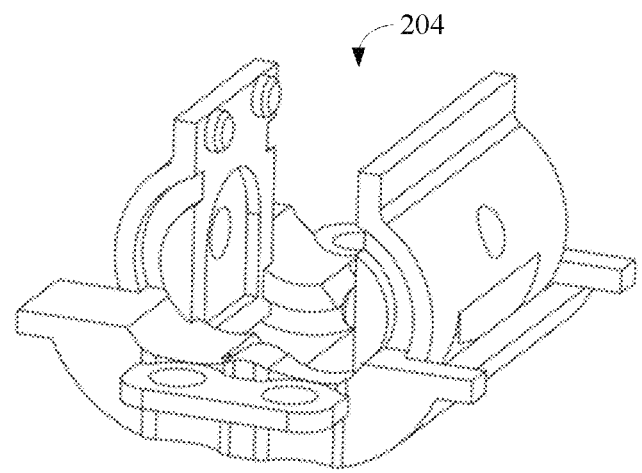
FIG. 19 is a schematic diagram of another state of the second hinge in FIG. 18, according to an exemplary embodiment.

In this embodiment, as shown in FIG. 16, the hinge assembly 200 may comprise three first hinges 201, which may be sequentially arranged along the length direction of the hinge assembly 200. The hinge assembly 200 may comprise any number of first hinges 201, which is not limited in the present disclosure. In other embodiments, the hinge assembly 200 may further comprise other hinges. For example, as shown in FIG. 17-FIG. 19, the hinge assembly 200 may further comprise a second hinge 204, which may comprise a second hinge bracket 2043, a third slider 2041, and a forth slider 2042. The second hinge bracket 2043 may further comprise a second arc guiding portion 20431, the third slider 2041 may comprise a third arc portion 20411, and the forth slider 2042 may comprise a forth arc portion 20421. Each of the third arc portion 20411 and the forth arc portion 20421 cooperates with the second arc guiding portion 20431. When the movement of the first hinge 201 is transmitted to the second hinge 204, the third arc portion 20411 and the forth arc portion 20421 may be driven into rotation relative to the second arc guiding portion 20431, and the second hinge 204 is switched between the state shown in FIG. 18 and the state shown in FIG. 19. The outside corner radius of the second arc guiding portion 20431 may be equal to the outside corner radius of the first arc guiding portion 21 to improve the aesthetic of the hinge assembly 200.

The second hinge 204 is described here by taking the structure shown in FIG. 17 as an example. In other embodiments, for the structure of the second hinge 204, reference may be made to the structure of the trajectory limiting mechanism 1 of the first hinge 201. In some embodiments, the related structures of the third slider 2041 and the fourth slider 2042 may be adaptively designed.

Figure 20:
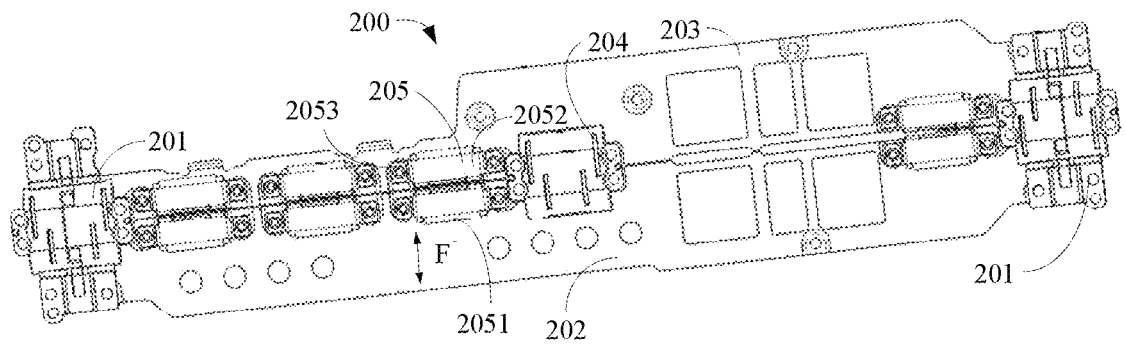
FIG. 20 is a schematic diagram illustrating another hinge assembly, according to an exemplary embodiment.
Figure 21:
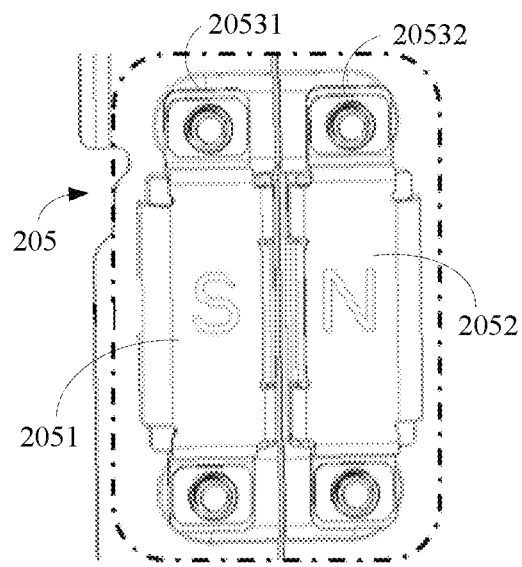
FIG. 21 is a schematic diagram illustrating a support member, according to an exemplary embodiment.
Figure 22:
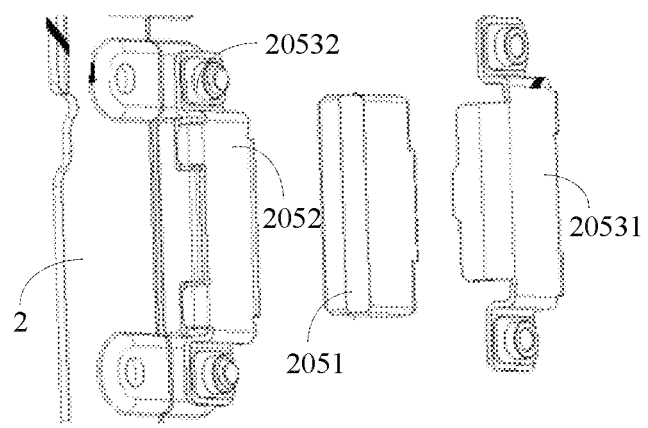
FIG. 22 is a partially exploded schematic diagram illustrating a support member, according to an exemplary embodiment.

In some embodiments, as shown in FIG. 20-FIG. 22, the hinge assembly 200 may also comprise at least one support member 205 configured to maintain the support steel sheets in the unfolded, flattened state, each support member 205 may comprise a first support member 2051, a second support member 2052 and a trestle 2053. The trestle 2053 is connected with both the first support member 2051 and the second support member 2052. The trestle 2053 is also connected to the first support steel sheet 202 and the second support steel sheet 203. When the first support steel sheet 202 and the second support steel sheet 203 are in an unfolded, flattened state, the first support member 2051 and the second support member 2052 interact with each other and generate a force (the force F shown in FIG. 20) parallel to a plane where the first support steel sheet 202 and the second support steel sheet 203 are located, to maintain both the first support steel sheet 202 and the second support steel sheet 203 in the unfolded, flattened state.

The number of the support members 205 is not limited, and may be specifically designed according to actual requirement. For example, in the embodiment as shown in FIG. 20, the hinge assembly 200 may comprise four support members 205, and the four support members 205 are located between two first hinges 201 at two ends, and one second hinge 204 is also located between the two first hinges 201. In other embodiments, the number of the support members 205 may be designed according to the force required to maintain the first support steel sheet 202 and the second support steel sheet 203 and the force that each support member 205 may provide. For example, there may be three or five or more support members 205, which is not limited in the present disclosure. Similarly, the number of the first hinge 201 and the second hinge 204 may be selected according to the length of the hinge assembly 200.

In the above embodiments, when the first support steel sheet 202 and the second support steel sheet 203 of the hinge 200 are in the unfolded, flattened state, the first support steel sheet 202 and the second support steel sheet 203 may be maintained in the unfolded, flattened state by the force generated by the support member 205, which force is parallel to the plane where the first support steel sheet 202 and the second support steel sheet 203 are located, to avoid that the first support steel sheet 202 and the second support steel sheet 203 are switched to the feedback state due to a weak external action. This is beneficial to maintain the hinge assembly 200 in the user's target state.

In this embodiment, as shown in FIG. 21 and FIG. 22, the trestle 2053 may comprise a first trestle 20531 and a second trestle 20532, the first trestle 20531 is connected with the first support member 2051, and the second trestle 20532 is connected with the second support member 2052. In order to ensure that the first trestle 20531 and the second trestle 20532 are adapted to the change in the relative positional relationship between the first support member 2051 and the second support member 2052, in an embodiment, as shown in FIG. 21 and FIG. 22, the first trestle 20531 and the second trestle 20532 may be two independent brackets. The first trestle 20531 moves with the change in the state of the first support steel sheet 202, and the second trestle 20532 moves with the change in the state of the second support steel sheet 203. When the first trestle 20531 and the second trestle 20532 are in a flat state, the first support member 2051 and the second support member 2052 generate a force that maintains the relative state between the first support steel sheet 202 and the second support steel sheet 203. In another embodiment, the first trestle 20531 and the second trestle 20532 are rotatably connected to each other, to change the relative positional relationship between the first trestle 20531 and the second trestle 20532 through a change in the relative positional relationship between the first support steel sheet 202 and the second support steel sheet 203.

Based on the above embodiments, as shown in FIG. 21 and FIG. 22, each of the first support member 2051 and the second support member 2052 may comprise a magnet. Furthermore, when the first support steel sheet 202 and the second support steel sheet 203 are in the unfolded, flattened state, sides of the first support member 2051 and the second support member 2052 that are opposite to each other are different, to generate a force between the first support member 2051 and the second support member 2052 based on the principle of the polarities of the magnets. For example, as shown in FIG. 21 and FIG. 22, when the first support steel sheet 202 and the second support steel sheet 203 are in the unfolded, flattened state, one side of the first support member 2051 facing the second support member 2052 is the south pole, and one side of the second support member 2052 facing the first support member 2051 is the north pole. In this embodiment, unlike the means of snapping or contact friction, the magnet group is provided to generate the force between the first support steel sheet 202 and the second support steel sheet 203 in the unfolded, flattened state, and there is no wear and tear caused by friction. Moreover, when the south pole of the first support member 2051 is opposite to the north pole of the second support member 2052, the force between the first support member 2051 and the second support member 2052 is the largest. When there is no external force, the first support member 2051 and the second support member 2052 may be maintained in the current positional relationship, which may avoid shaking.

In another embodiment, one of the first support member 2051 and the second support member 2052 may comprise a magnet, and the other one of the first support member 2051 and the second support member 2052 may comprise an electromagnetic coil. When the electromagnetic coil is energized, the magnetic field generated by the electromagnetic coil may interact with the magnet, to generate a force that maintains the first support steel sheet 202 and the second support steel sheet 203 in the unfolded, flattened state. For example, the first support member 2051 may comprise a magnet, and the second support member 2052 may comprise an electromagnetic coil. By acquiring the state of the first hinge 201, the state of the first support steel sheet 202 and the second support steel sheet 203 may be determined. When it is determined that the first support steel sheet 202 and the second support steel sheet 203 are in the unfolded, flattened state, the second support member 2052 is energized, to generate a force that maintains the first support steel sheet 202 and the second support steel sheet 203 in the unfolded, flattened state. When an external force intend to change the state of the first hinge 201 is detected, the second support member 2052 is deenergized, to allow the change of the state of the first support steel sheet 202 and the second support steel sheet 203.

In the above embodiments, the first support steel sheet 202 and the second support steel sheet 203 are connected with the first hinge 201 and the second hinge 204, respectively. When the surfaces of the first support steel sheet 202 and the second support steel sheet 203 facing the same side are in a same plane, the first support steel sheet 202 and the second support steel sheet 203 are switched to the unfolded, flattened state as a whole. When the surfaces of the first support steel sheet 202 and the second support steel sheet 203 facing the same side are directly at a non-zero angle to one another, the first support steel sheet 202 and the second support steel sheet 203 are in a folded state. The non-zero angle may be equal to 30°, 50°, 60°, or 90°, etc., which is not limited in the present disclosure.

Figure 23:
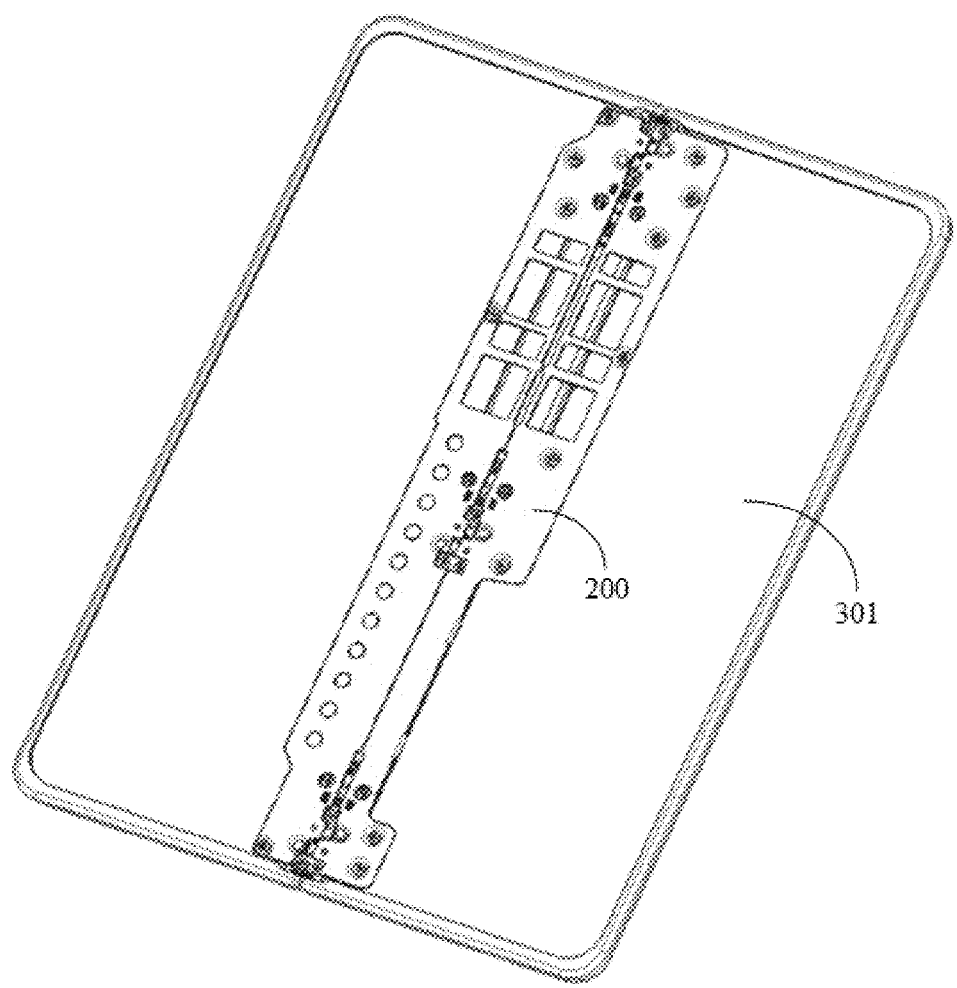
FIG. 23 is a schematic diagram illustrating a foldable electronic device, according to an exemplary embodiment.
Figure 24:
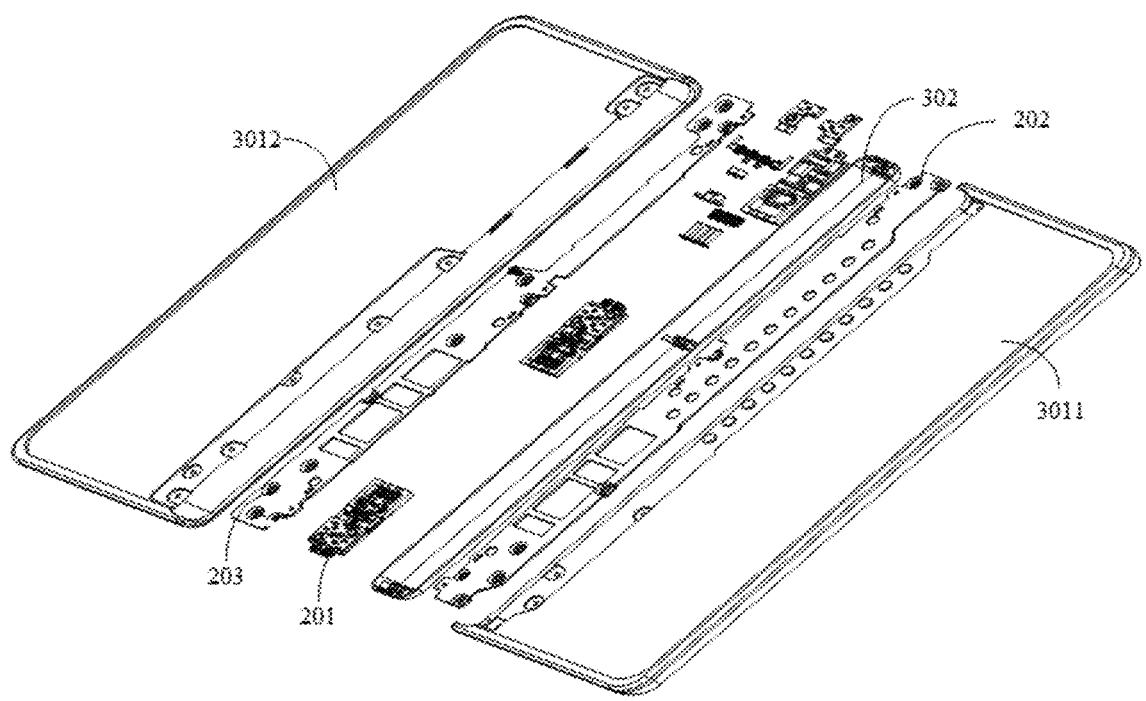
FIG. 24 is an exploded schematic diagram illustrating a foldable electronic device, according to an exemplary embodiment.

Based on the hinge assembly 200 described in the above embodiments, as shown in FIG. 23 and FIG. 24, the present disclosure also provides a foldable electronic device, which may comprise a middle frame 301 and the hinge assembly 200. Both the first support steel sheet 202 and the second support steel sheet 203 of the hinge assembly 200 are connected to the middle frame 301. The first slider 11 of the first hinge 201 is connected with the first support steel sheet 202 and the second slider 12 is connected with the second support steel sheet 203, and there is a second hinge 204 (FIGS. 17-19). The third slider 2041 of the second hinge 204 is connected with the first support steel sheet 202 and the forth slider 2042 is connected with the second support steel sheet 203, and the first support steel sheet 202 and the second support steel sheet 203 are both connected with the middle frame 301, to drive the middle frame 301 to switch between the unfolded, flattened state and the folded state. For example, the middle frame 301 may comprise a first middle frame 3011 and a second middle frame 3012. The first middle frame 3011 is connected with the first support steel sheet 202 and the second middle frame 3012 is connected with the second support steel sheet 203, so that the first middle frame 3011 and the second middle frame 3012 may be driven to fold from top to bottom as shown in FIG. 23 or to fold from bottom to top by the movement of the first support steel sheet 202 and the second support steel sheet 203. The electronic device may be a handheld terminal or an electronic reader, which is not limited in the present disclosure.

In this embodiment, as shown in FIG. 24, the foldable electronic device may further comprise a hinge housing 302, which is fixedly connected with hinge brackets of the hinge assembly 200. For example, the hinge housing 302 is connected with the first hinge bracket 2 of the first hinge 201. When the foldable electronic device is provided with the second hinge 204, the hinge housing 302 may also be connected with the second hinge bracket 2041, so that the hinge assembly 200 may move relative to the hinge housing 302. Moreover, due to the shelter of the hinge housing 302, the hinge assembly 200 invisible to the user, which improves the aesthetics.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are exemplary only, with a true scope and spirit of the present disclosure is indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:
1. A hinge, comprising:
 a trajectory limiting mechanism, comprising a first slider and a second slider;
 a first hinge bracket, cooperating with the first slider and the second slider, the first hinge bracket being configured to limit rotation trajectories of the first slider and the second slider;
 a synchronization mechanism, cooperating with the trajectory limiting mechanism, for driving the first slider and the second slider into rotation relative to the first hinge bracket around a preset direction respectively; and
 a locking mechanism, cooperating with the synchronization mechanism, the locking mechanism having a locked state in which the locking mechanism is configured to prevent movement of the synchronization mechanism to maintain a relative positional relationship between the first slider and the second slider,
 wherein the synchronization mechanism comprises:
 a cylindrical gear set, a first guide rod gear, and a second guide rod gear, each of the first guide rod gear and the second guide rod gear comprising a gear end and a guide rod end, the gear end of the first guide rod gear being engaged with a first end gear of the cylindrical gear set, the gear end of the second guide rod gear being engaged with a second end gear of the cylindrical gear set, the guide rod end of the first guide rod gear extending to the first slider and the guide rod end of the second guide rod gear extending to the second slider to drive each of the first slider and the second slider into rotation relative to the first hinge bracket in folded and unfolded states when the first and second sliders are facing to each other and away from each other respectively.

2. The hinge of claim 1, wherein an extension direction of the guide rod end of the first guide rod gear and an extension direction of the guide rod end of the second guide rod gear are parallel to each other, and are both perpendicular to the preset direction and a thickness direction of the hinge.

3. The hinge of claim 2, wherein the first hinge bracket comprises a first arc guiding portion, the first slider comprising a first arc portion, the second slider comprising a second arc portion, each of the first arc portion and the second arc portion cooperating with the first arc guiding portion; and the first hinge bracket further comprises two upright blocks respectively connected with the first arc guiding portion, the two upright blocks being located between two first arc portions of the first slider and two second arc portions of the second slider, the gear end of the first guide rod gear, the gear end of the second guide rod gear, and the cylindrical gear set being located between the two upright blocks.

4. The hinge of claim 1, wherein an extension direction of the guide rod end of the first guide rod gear is the same as an extension direction of the guide rod end of the second guide rod gear, and the extension direction of the guide rod end of the first guide rod gear and the extension direction of the guide rod end of the second guide rod gear are both parallel to the preset direction.

5. The hinge of claim 4, wherein the trajectory limiting mechanism, the synchronization mechanism, and the locking mechanism are sequentially arranged along the preset direction.

6. The hinge of claim 5, wherein the first hinge bracket comprises a first arc guiding portion, the first slider comprising a first arc portion, the second slider comprising a second arc portion, each of the first arc portion and the second arc portion cooperating with the first arc guiding portion;

the guide rod end of the first guide rod gear is connected to one side of the first slider adjacent to the synchronization mechanism; and the guide rod end of the second guide rod gear is connected to one side of the second slider adjacent to the synchronization mechanism.

7. The hinge of claim 1, wherein the first slider comprises a first hollow sliding slot, the second slider comprising a second hollow sliding slot, the guide rod end of the first guide rod gear extending into the first hollow sliding slot, the guide rod end of the second guide rod gear extending into the second hollow sliding slot.

8. The hinge of claim 1, wherein the first slider comprises a first groove, and the second slider comprises a second groove; and the hinge further comprises a first limiting plate and a second limiting plate, the first limiting plate covering the first groove to form a sliding slot that cooperates with the guide rod end of the first guide rod gear, the second limiting plate covering the second groove to form a sliding slot that cooperates with the guide rod end of the second guide rod gear.

9. The hinge of claim 1, wherein the synchronization mechanism comprises rotating shafts, each of the rotating shafts being connected with a respective one of the gears of the cylindrical gear set; and the locking mechanism comprises a first transmission member and a second transmission member, the first transmission member being connected with the rotating shafts to rotate with the rotating shafts, and when the rotating shafts drive the first transmission member to be switched to a preset cooperation state with the second transmission member, the locking mechanism is switched to a locked state.

10. The hinge of claim 9, wherein one of the first transmission member and the second transmission member comprises at least one protruding portion, and the other one of the first transmission member and the second transmission member comprises a recess portion that cooperates with the protruding portion and, when the protruding portion extends into the recess portion, the first transmission member and the second transmission member are switched to the preset cooperation state; and the locking mechanism further comprises:
a buffering member, the buffering member being in contract with the second transmission member, and when the second transmission member moves in the preset direction, the buffering member is extended or compressed.

11. The hinge of claim 10, wherein the buffering member comprises a telescopic flexible member.

12. The hinge of claim 10, wherein the buffering member comprises:
a guide rod, one end of the guide rod being connected to the second transmission member, and the other end of the guide rod being connected to the first hinge bracket;
a compression spring, the compression spring being mounted around the guide rod, and being in contract with the second transmission member.

13. A hinge assembly for an electronic device, comprising:
at least one first hinge, comprising:
a trajectory limiting mechanism, comprising a first slider and a second slider;
a first hinge bracket, cooperating with the first slider and the second slider, the first hinge bracket being configured to limit rotation trajectories of the first slider and the second slider;
a synchronization mechanism, cooperating with the trajectory limiting mechanism, for driving the first slider and the second slider into rotation relative to the first hinge bracket around a preset direction respectively; and
a locking mechanism, cooperating with the synchronization mechanism, the locking mechanism having a locked state in which the locking mechanism is configured to prevent the movement of the synchronization mechanism to maintain a relative positional relationship between the first slider and the second slider;
a first support steel sheet connected with the first slider; and
a second support steel sheet, the second support steel sheet being connected with the second slider to change a relative positional relationship between the first support steel sheet and the second support steel sheet through a change in the relative positional relationship between the first slider and the second slider, wherein the synchronization mechanism comprises:

a cylindrical gear set, a first guide rod gear, and a second guide rod gear, each of the first guide rod gear and the second guide rod gear comprising a gear end and a guide rod end, the gear end of the first guide rod gear being engaged with a first end gear of the cylindrical gear set, the gear end of the second guide rod gear being engaged with a second end gear of the cylindrical gear set, the guide rod end of the first guide rod gear extending to the first slider and the guide rod end of the second guide rod gear extending to the second slider to drive each of the first slider and the second slider into rotation relative to the first hinge bracket in folded and unfolded states when the first and second sliders are facing to each other and away from each other respectively.

14. The hinge assembly of claim 13, wherein the hinge assembly further comprises:

at least one second hinge, comprising a second hinge bracket, a third slider, and a forth slider, the second hinge bracket comprising a second arc guiding portion;

wherein the third slider comprises a third arc portion, the forth slider comprises a forth arc portion, and each of the third arc portion and the forth arc portion cooperate with the second arc guiding portion.

15. The hinge assembly of claim 13, wherein the hinge assembly further comprises:

at least one support member configured to maintain the first and second support steel sheets in the unfolded, flattened state, each support member comprising a first support member, a second support member, and a trestle, the trestle being connected with both the first support member and the second support member, and the trestle being connected with both the first support steel sheet and the second support steel sheet;

wherein when the first and second support steel sheets are in the unfolded, flattened state, the first support member and the second support member interact with each other and generate a force parallel to a plane where the first and second support steel sheets are located, to maintain the first and second support steel sheets in the unfolded, flattened state.

16. The hinge assembly of claim 15, wherein each of the first support member and the second support member comprises a magnet, a polarity of one side surface of the first support member being different from a polarity of one side surface of the second support member and, when the first support steel sheet and the second support steel sheet are both in the unfolded, flattened state, the two side surfaces with different polarities are arranged to be opposite to one another.

17. The hinge assembly of claim 15, wherein one of the first support member and the second support member comprises a magnet, and the other one of the first support member and the second support member comprises an electromagnetic coil;

wherein when the first support steel sheet and the second support steel sheet are both in the unfolded, flattened state, the electromagnetic coil is in an energized state, to interact with the magnet to generate a force that maintains the first support steel sheet and the second support steel sheet in the unfolded, flattened state.

18. A foldable electronic device, comprising:

a hinge assembly; and a middle frame, wherein the hinge assembly comprises:

at least one first hinge, wherein the first hinge comprises:

a trajectory limiting mechanism, comprising a first slider and a second slider;

a first hinge bracket, cooperating with the first slider and the second slider, the first hinge bracket being configured to limit rotation trajectories of the first slider and the second slider;

a synchronization mechanism, cooperating with the trajectory limiting mechanism, for driving the first slider and the second slider into rotation relative to the first hinge bracket around a preset direction respectively; and a locking mechanism, cooperating with the synchronization mechanism, the locking mechanism having a locked state in which the locking mechanism is configured to prevent the movement of the synchronization mechanism to maintain a relative positional relationship between the first slider and the second slider;

a first support steel sheet connected with the first slider; and a second support steel sheet, the second support steel sheet being connected with the second slider to change a relative positional relationship between the first support steel sheet and the second support steel sheet through a change in the relative positional relationship between the first slider and the second slider, and wherein the middle frame is connected with both the first support steel sheet and the second support steel sheet of the hinge assembly, to switch a state of the middle frame along with a positional change of the first support steel sheet and the second support steel sheet, wherein the synchronization mechanism comprises:

a cylindrical gear set, a first guide rod gear, and a second guide rod gear, each of the first guide rod gear and the second guide rod gear comprising a gear end and a guide rod end, the gear end of the first guide rod gear being engaged with a first end gear of the cylindrical gear set, the gear end of the second guide rod gear being engaged with a second end gear of the cylindrical gear set, the guide rod end of the first guide rod gear extending to the first slider and the guide rod end of the second guide rod gear extending to the second slider to drive each of the first slider and the second slider into rotation relative to the first hinge bracket in folded and unfolded states when the first and second sliders are facing to each other and away from each other respectively.

19. The foldable electronic device of claim 18, wherein the foldable electronic device further comprises:

a hinge housing fixedly connected with hinge brackets of the hinge assembly.

* * * * *